CONTROLLED DOPING OF SEMICONDUCTORS

Filed March 6, 1968

INVENTORS
GEORGE CHIZINSKY
EDWARD SIMON
BY Joseph Weingarten
Stanley M. Schwager
ATTORNEYS United States Patent Office 3,574,009

Patented Apr. 6, 1971

3,574,009

CONTROLLED DOPING OF SEMICONDUCTORS

George Chizinsky, Beverly Farms, and Edward Simon, Manchester, Mass., assignors to Unitrode Corporation, Watertown, Mass.

Filed Mar. 6, 1968, Ser. No. 710,896
Int. Cl. H011 7/34
U.S. Cl. 148—187 10 Claims

ABSTRACT OF THE DISCLOSURE

A method for controllably doping a semiconductor body in which, only time and temperature are the process parameters controlled to achieve intended doping profiles. A concentration of dopant determined only by temperature is formed on a semiconductor surface to act as a source layer for subsequent diffusion. A selected amount of dopant from this source layer is driven into the semiconductor and, after drive-in of the selected amount, further drive-in of dopant is prevented. This selected amount of dopant is then diffused into the semiconductor to achieve the desired impurity concentration and depth.

FIELD OF THE INVENTION

This invention relates to the fabrication of semiconductor devices and more particularly to a method of controlling the doping of semiconductor material for use in such devices.

BACKGROUND OF THE INVENTION

In the manufacture of semiconductor devices, it is well known to selectively dope a semiconductor body with various doping materials to provide regions within the semiconductor body having desired conductivity types, thereby to form the requisite device structure. Such doping is often accomplished by a diffusion process wherein a semiconductor body is placed within an atmosphere containing a selected amount of doping material, the atmosphere being at an elevated temperature sufficient to allow diffusion of the dopant into the semiconductor body. Control of the amount of doping in such a diffusion operation is extremely critical as both the temperature and concentration of the diffusing atmosphere must be carefully controlled to achieve the intended result, as well as the flow rate of the diffusing atmosphere and the time of exposure of the semiconductor body to the diffusing atmosphere. In accordance with the present invention, controlled doping of a semiconductor body is achieved in a less critical manner by providing a process of doping wherein only time and temperature are the operative parameters which must be controlled to achieve intended doping concentrations and depths.

SUMMARY OF THE INVENTION

Briefly, the present invention comprises a process for controllably doping a semiconductor body, wherein a temperature dependent concentration of doping material is formed on a surface of a semiconductor body, this deposit of doping material acting as a source layer from which controlled diffusion into the semiconductor body is accomplished. The source layer is formed by exposing the semiconductor body to an atmosphere containing an excess amount of dopant at a temperature sufficient to form a layer of a compound of the dopant on a surface of the body. Some of the dopant in the source layer diffuses a relatively short distance into the body to provide a controlled source of doping material which can then be precisely diffused further into the semiconductor body, as will be explained hereinbelow. An oxide layer is then formed as a barrier layer at the interface of the source layer and the semiconductor body to prevent further penetration of dopant from the source layer into the body.

The semiconductor body is next raised to a diffusion temperature to cause controlled diffusion of the dopant previously driven in from the source layer into the body. This diffusion step is conducted for a time sufficient to achieve an intended diffusion profile, that is, an intended depth and concentration of dopant within the semiconductor body.

Considering the novel process in greater detail, the sequence of steps is as follows. A semiconductor body of, typically, silicon is exposed to an atmosphere containing an excessive concentration of dopant and an oxidizing gas to thereby form a compound of the dopant on the surface of the semiconductor body, this compound acting as a source layer. The concentration of dopant in this source layer is a function of temperature, the particular temperature being chosen such that relatively little diffusion of the dopant takes place. According to the invention, the concentration of dopant in the source layer is in excess of the concentration needed to dope the semiconductor body to the desired extent. An inert gas is then passed over the semiconductor body, which may be maintained at this same lower temperature, to provide a so-called "drive-in" of a predetermined amount of dopant from the source layer into the semiconductor body based upon the temperature dependent diffusion coefficient and time. Oxygen is now passed over the semiconductor body, the oxygen reacting with the semiconductor and source layer interface to provide an oxide barrier at this interface which prevents more dopant from the source layer from being driven into the semiconductor. The semiconductor body is next exposed to a diffusing temperature in a suitable environment of, typically, an oxidizing atmosphere for a time sufficient to controllably diffuse the dopant into the semiconductor body to achieve the intended impurity concentration and depth.

Thus, only time and temperature are accurately controlled in the novel process, and semiconductor devices can, therefore, be more efficiently fabricated by this novel process as fewer variables need be controlled than in conventional techniques. In addition, the present process allows a higher packing density and less critical placement of semiconductor wafers in a diffusion furnace. In conventional processes, the flow rate, composition and temperature of the doping atmosphere are critical variables and the placement and spacing of wafers in a diffusion furnace must be chosen to minimize disturbance of this flow rate. The novel process, however, since it is not as critically affected by the flow rate or concentration of the doping atmosphere, does not limit as severely the placement or packing density of wafers in the furnace.

DESCRIPTION OF THE DRAWINGS

The invention will be more fully understood from the following detailed description, taken in conjunction with the accompanying drawings, in which.

DETAILED DESCRIPTION OF THE INVENTION

The process embodying the invention is carried out with well known apparatus commonly employed for diffusion in semiconductor device fabrication. Such apparatus need not, therefore, be considered at length herein.

Generally, the diffusion and related processes are carried out in a diffusion furnace which includes an elongated quartz tube having an inlet end coupled to a source of suitable vapors required for the process, and heating coils disposed around the quartz tube along its length to provide one or more zones of selected temperatures, depending upon particular process requirements. The semiconductor bodies to be processed are located within the furnace tube and supported therein by a suitable mount.

Figure 1:
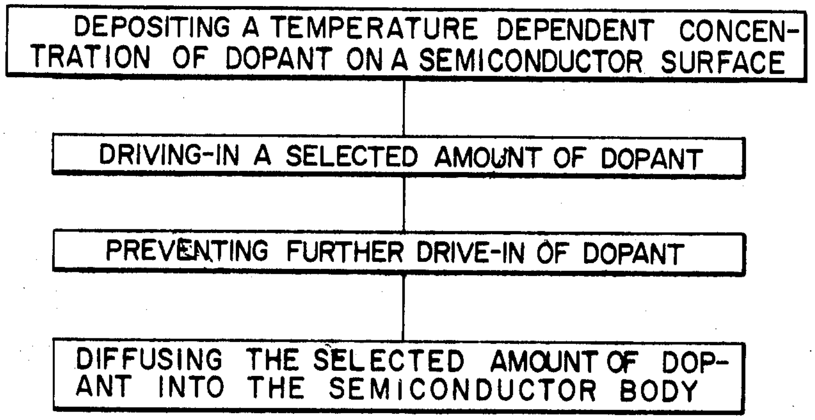
FIG. 1 is a block diagram depicting the steps of the process according to the invention.
Figures 2, 3:
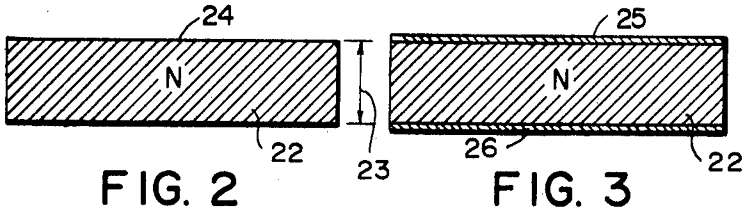
FIGS. 2 through 9 are greatly enlarged sectional elevation views of a semiconductor body during various stages of fabrication according to the invention.

In the fabrication of semiconductor devices, the semiconductor body is generally of wafer form and a plurality of regions on a surface of the wafer are identically processed to provide a plurality of devices which are then cut from the wafer for individual packaging and terminal connection. The novel process is diagrammed in FIG. 1 and includes four steps. A temperature dependent concentration of dopant is deposited on a surface of a semiconductor body to form a source layer to dopant. A selected amount of the dopant from this source layer is driven in or diffused a short distance into the semiconductor body. The semiconductor body is then treated to prevent further drive-in of dopant into the body by forming an oxide barrier layer at the interface between the source layer and the semiconductor body. The thus formed semiconductor structure is then exposed to a temperature sufficient to allow controlled diffusion of the driven-in dopant further into the body.

For purposes of discussion the novel process will be described in conjunction with a silicon semiconductor material, although it is to be understood that the process is equally applicable to other semiconductor materials. To carry out the novel process, a body of silicon, usually in wafer form, is placed in a furnace tube which is at the temperature required to achieve the desired drive-in of dopant in the semiconductor material, and an oxidizing gas and dopant-containing vapor is introduced into the furnace tube to form an excess dopant-containing atmosphere which causes a compound of the dopant to be formed on a surface of the silicon body. The concentration of dopant in this source layer is a function of temperature and is chosen to be in excess of the amount of dopant needed to achieve an intended impurity concentration. By reason of the relatively low process temperature employed during this stage of the process, little diffusion of dopant occurs and the dopant remains essentially at the surface of the silicon body. An inert gas is next introduced into the furnace tube and the silicon body is maintained at this lower process temperature for a time sufficient to drive-in a predetermined amount of dopant from the source layer into the silicon body. By reason of the relatively low temperature, the dopant is driven into the silicon body a relatively short distance, the distance being less than normal diffusion depths. The predetermined amount of dopant thus driven-in is subsequently employed in the process as a controlled source of dopant which can be precisely diffused into the semiconductor body to achieve the intended impurity profile. Before conducting the diffusion operation, however, the source layer must be isolated from the semiconductor body to prevent further dopant from being driven-in and thereby altering the predetermined concentration of dopant previously driven-in from the source layer. Such isolation is accomplished by forming a barrier layer of, typically, an oxide at the interface between the source layer and the semiconductor body. Oxygen is introduced into the furnace tube, which is maintained at the same temperature, the oxygen reacting at the interface of the source layer and the silicon to form an oxide barrier layer at this interface. The oxygen environment is maintained for a time sufficient to provide a barrier layer of suitable thickness to prevent further drive-in of dopant from the source layer at this lower temperature. Diffusion of the previously driven-in dopant is then accomplished by raising the silicon body to a higher temperature in an oxidizing atmosphere and for a time such to provide the intended depth and concentration of dopant in the silicon body.

Figure 4:
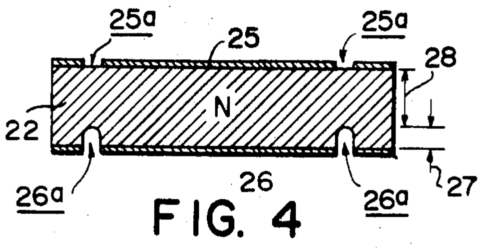
Figure 5:
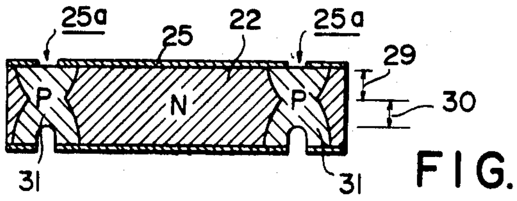
Figure 6:
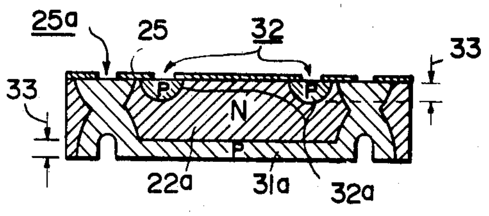

Particular process temperatures and materials will, of course, depend upon the particular semiconductor device being fabricated and its intended characteristics. As an example of the novel process, the sequence of steps necessary to fabricate a planar thyristor will now be described in conjunction with FIGS. 2 through 9. A body of N-type silicon 22 having a thickness of about 8 mils has a surface 24 which is lapped and polished in a well known manner to allow later diffusion of impurity materials to accurately controlled depths. The top and bottom surfaces of body 22 are oxidized to provide protective $SiO_2$ layers 25 and 26, respectively, these layers being typically about 10,000 angstroms thick. After photoresist material has been applied to the top and bottom surfaces and then suitably masked, exposed and etched, the material has the configuration shown in FIG. 4, wherein the oxide layers 25 and 26 have been stripped away in identical ring-like paths **25*a* and 26*a*, which are in substantial alignment with one another. The bottom path 26*a* is chemically etched to a ring-like groove having a depth of about 2 mils into the body, the top surface being waxed or otherwise protected to prevent deeper etching of path 25*a*. The remaining depth 28 of mass 22 between the etched rings is thus about 6 mils. A deep diffusion of an impurity such as boron which produces P-type characteristics is conducted through both etched ring openings 25*a* and 26*a* until the diffusions merge. As illustrated in FIG. 5, penetration 29 from the top and penetration 30 from the bottom, which are each about 3 mils thick, merge to form a ring-like region 31 of P-type material in body 22**.

The deep diffusion process is accomplished according to the invention as follows. The silicon bodies are suitably stacked and positioned in a diffusion furnace and oxygen is flushed through the furnace at a rate of 5 liters per minute for 5 minutes. A mixture of oxygen flowing at 4 liters per minute and oxygen bubbled through boron tribromide flowing at 1 liter per minute is then passed through the furnace tube for 7 minutes at a temperature of 1115° C. to form the fixed concentration of boron oxide on the surface of the silicon body. This compound forms the source layer of boron for subsequent diffusion. A mixture of 98% nitrogen and 2% oxygen is then flowed through the furnace tube at a rate of 5 liters per minute for 25 minutes to drive in boron from the source layer partially into the silicon body. Oxygen is then introduced into the furnace tube at a rate of 5 liters per minute for a period of 10 minutes to form a barrier oxide layer at the interface between the source layer and the silicon, thereby to prevent further drive-in of boron from the source layer into the semiconductor body. Steam is next introduced at 1275° C. for 1 hour to form a barrier layer suitable to mask diffusion from the source layer at this higher temperature. Diffusion is accomplished at a temperature of 1275° C. for 40 hours in a mixture of 98% nitrogen and 2% oxygen, to diffuse the previously driven-in boron into the silicon body to provide the intended P-type conductivity region.

Next, the silicon oxide layer 26 is stripped away using conventional photographic etching techniques and the same kind of stripping is performed at the top to produce a ring-like opening 32 above the N-type material. This is followed by a further deep diffusion of an impurity which imparts P-type characteristics to the underlying material to a depth of about 2 mils on the exposed top and bottom, as designated by dimension 33 in FIG. 6. The process for this second deep diffusion is the same as stated hereinabove, except that the final diffusion step is conducted for a period of 22 hours. Ring-like region 31 thus becomes merged with the bottom P-type layer **31*a*, and there is an inner ring-like zone 32*a* of P-type material at the top which has been diffused deeply enough so that its radius of curvature is relatively large and will present no sharp corners to the adjoining N-type material 22***a*. A portion of the top oxide layer 25 which is encompassed within the ring-like opening 32 is next stripped away, again using conventional photographic etching techniques, exposing the underlying N-type material, and a relatively shallow diffusion is then performed with impurity material, such as boron, imparting P-type conductivity characteristics.

This shallow diffusion process is accomplished as follows. The furnace is set to a temperature of 1015° C. and, as before, oxygen is flushed through the furnace tube at a rate of 5 liters per minute for 5 minutes. A mixture of oxygen flowing at 4 liters per minute and oxygen bubbled through boron tribromide flowing at 1 liter per minute is then directed through the furnace tube for 10 minutes to form the controlled concentration source layer of boron oxide on the silicon surface. A mixture of 98% nitrogen and 2% oxygen is then flowed through the furnace tube at 5 liters per minute for 30 minutes to drive in boron from the source layer into the silicon, and oxygen is then flowed through the furnace tube for 10 minutes at a rate of 5 liters per minute to form an oxide barrier layer between the source layer and the silicon body. Steam is then introduced at a temperature of 1275° C. for one hour to form a barrier layer suitable to mask diffusion from the source layer at this higher temperature. A mixture of 98% nitrogen and 2% oxygen is then introduced into the system and diffusion conducted at 1275° C. for a period of three and one half hours to form region 32*b*.

Figure 7:
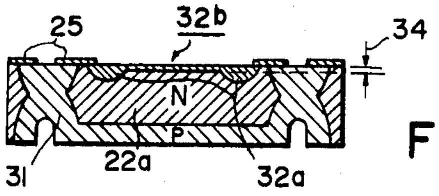
Figure 8:
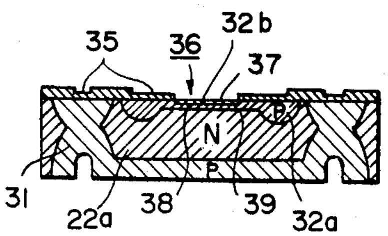
Figure 9:
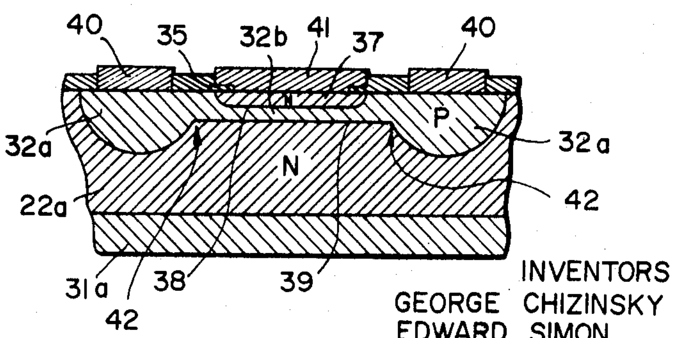

As seen in FIG. 7, the shallow diffusion results in a shallow P-type layer 32*b* of precise depth below the flat top surface, the uniform thickness 34 being typically about 0.6 mil. Following the production of shallow layer 32*b*, protective oxide 35 is grown back over the top and is then stripped away at a site 36 over the shallow layer so that a very shallow diffusion of impurity material, such as phosphorous, producing N-type conductivity characteristics will then yield the N-type layer 37 within the relatively shallow P-type layer 32*b*. N-type layer 37 forms a junction 38 closely and precisely spaced in relation to the junction 39 between P-type layer 32*b* and N-type zone 22*a*, this highly exact relationship being possible by reason of the accurately controlled shallow diffusion from the very flat top surface of the silicon. The final device structure of FIG. 8 is shown in enlarged form in FIG. 9, and includes a metal contact 40 connected to outer ring 32*a* and a metal contact 41 connected to N-type layer 37. These metal contacts are provided by conventional techniques including removal of the oxide at requisite locations and evaporation of conducting material to provide the necessary contacts where needed.

Various modifications and alternatives will occur to those versed in the art without departing from the true spirit and scope of the invcention. Accordingly, the invention is not to be limited by what has been particularly shown and described, except as indicated in the appended claims.

What is claimed is:

1. A method of controllably doping a semiconductor body comprising the steps of forming a source layer on a surface of a semiconductor body, said source layer containing a concentration of dopant determined only by temperature and a concentration in excess of the amount needed to produce an intended impurity concentration in said semiconductor body;

driving in a selected amount of dopant from said source layer into said semiconductor body thereby to provide a controlled source of dopant for subsequent diffusion into said body;

forming a barrier layer at the interface of said source layer and semiconductor body, said barrier layer being operative to isolate said source layer from said semiconductor body to prevent further drive-in of dopant from said source layer; and diffusing said selected amount of dopant into said semiconductor body to achieve an intended impurity depth and concentration.

2. The method according to claim 1 wherein said source layer is formed at a temperature at which relatively little diffusion occurs.

3. The method according to claim 1 wherein said semiconductor body is silicon, said source layer is formed at a temperature at which relatively little diffusion occurs, and said concentration of dopant is formed from a dopant-containing atmosphere in which the dopant concentration is greater than that needed to dope the semiconductor body to the desired extent.

4. A method of controllably doping a semiconductor body comprising the steps of:

exposing a body of semiconductor material to an excess dopant-containing atmosphere and an oxidizing gas at a predetermined temperature thereby to form a source layer of a compound of the dopant on a surface of said semiconductor body said source layer having a concentration of dopant in excess of the amount needed to produce an intended impurity concentration in said body;

exposing said body of semiconductor material to an inert atmosphere at a temperature and for a time sufficient to drive in a selected amount of dopant from said source layer into said body;

exposing said body of semiconductor material to an oxygen atmosphere to form a barrier layer which isolates said source layer from said body and prevents further drive-in of dopant from said source layer; and exposing said body of semiconductor material to a selected temperature and for a time sufficient to diffuse the driven-in dopant further into said body to achieve an intended impurity concentration and depth.

5. The method according to claim 4 wherein said body of semiconductor material is silicon.

6. The method according to claim 5 wherein said semiconductor body is silicon and said source layer is boron oxide.

7. The method according to claim 4 wherein said compound of the dopant is an oxide.

8. The method according to claim 4 wherein said semiconductor body is silicon, said dopant-containing atmosphere is boron tribromide, and said predetermined temperature is in the range of 950° C.–1150° C.

9. The method according to claim 1 wherein said selected amount of dopant from said source layer is driven into said semiconductor body to a depth less than the normal diffusion depth of said body.

10. A method of controllably doping a semiconductor body comprising the steps of:

exposing a body of silicon to an atmosphere containing an excessive concentration of boron tribromide and oxygen at a temperature in the range of 950° C.–1150° C. for a time sufficient to form a layer of a boron oxide on a surface of said silicon;

exposing said silicon body to an inert atmosphere at a temperature in the range of 950° C.–1150° C. for a period of about 25 minutes to drive in a selected amount of boron from said boron oxide layer into said silicon body;

exposing said silicon body to an oxygen atmosphere at a temperature in the range of 950° C.–1150° C. for approximately 10 minutes to form an oxide barrier layer at the interface of said silicon body and boron oxide layer;

exposing said silicon body to steam at a diffusion temperature for about one hour to further form said oxide barrier layer; and exposing said silicon body to a slightly oxidizing atmosphere at the diffusion temperature and for a time sufficient to achieve the desired impurity depth and concentration in said silicon body.

References Cited

UNITED STATES PATENTS

| | | | |
|---|---|---|---|
| 3,145,126 | 8/1964 | Hardy | 148—187 |
| 3,203,840 | 8/1965 | Harris | 148—187 |
| 3,287,187 | 11/1966 | Rosenheinrich | 148—188 |
| 3,312,577 | 4/1967 | Dunster et al. | 148—187 |
| 3,457,125 | 7/1969 | Kerr | 148—188 |

OTHER REFERENCES

Runyan, W. R.: Silicon Semiconductor Technology, N.Y., McGraw-Hill, 1965, pp. 147–148, TK7872.S4R82.

HYLAND BIZOT, Primary Examiner

R. A. LESTER, Assistant Examiner

U.S. Cl. X.R.

148—188

PO-1050
(5/69)

UNITED STATES PATENT OFFICE
CERTIFICATE OF CORRECTION

Patent No. 3,574,009 Dated April 6, 1971

Inventor(s) George Chizinsky and Edward Simon

It is certified that error appears in the above-identified patent and that said Letters Patent are hereby corrected as shown below:

Column 3, line 18, "to" (second occurrence) should be --of--.

Column 5, line 54, "invcention" should be --invention--.

Column 6, line 40, "claim 5" should be --claim 4--

Signed and sealed this 7th day of March 1972.

(SEAL)
Attest:

EDWARD M.FLETCHER,JR.
Attesting Officer

ROBERT GOTTSCHALK
Commissioner of Patents